(12) United States Patent
Coskun et al.

(10) Patent No.: US 10,599,055 B1
(45) Date of Patent: Mar. 24, 2020

(54) SELF ALIGNING SYSTEMS AND METHODS FOR LITHOGRAPHY SYSTEMS

(71) Applicant: Applied Materials, Inc., Santa Clara, CA (US)

(72) Inventors: Tamer Coskun, San Jose, CA (US); Rudolf C. Brunner, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/192,591

(22) Filed: Nov. 15, 2018

(51) Int. Cl.
*G03B 27/42* (2006.01)
*G03F 9/00* (2006.01)
*G03F 7/20* (2006.01)

(52) U.S. Cl.
CPC .......... *G03F 9/7088* (2013.01); *G03F 7/7085* (2013.01); *G03F 7/70483* (2013.01); *G03F 7/70683* (2013.01); *G03F 9/7007* (2013.01); *G03F 9/7049* (2013.01); *G03F 9/7073* (2013.01); *G03F 9/7076* (2013.01)

(58) Field of Classification Search
CPC ......... H01L 2223/54413; H01L 23/544; H01L 2223/54426; G03F 9/70; G03F 9/7003; G03F 9/7007; G03F 9/7011; G03F 9/7015; G03F 9/7073; G03F 9/7076; G03F 9/7084; G03F 9/7088; G03F 9/7049; G03F 9/7046; G03F 7/70; G03F 7/70483; G03F 7/70491; G03F 7/70525; G03F 7/70691; G03F 7/708; G03F 7/70616; G03F 7/70625; G03F 7/70633; G03F 7/70666; G03F 7/70685; G03F 7/70716; G03F 7/70775; G03F 7/70683; G01B 11/14; G01B 11/26; G02B 6/4221; G02B 6/4222; G02B 6/4224

USPC .... 355/46, 52, 53, 55, 72-77; 356/399-401; 250/492.1, 492.2, 492.22, 493.1
See application file for complete search history.

(56) References Cited

U.S. PATENT DOCUMENTS

| 5,350,715 A | * | 9/1994 | Lee | H01L 23/544 438/16 |
| 6,949,755 B2 | | 9/2005 | Tanaka | |
| 8,208,140 B2 | | 6/2012 | Hulsebos et al. | |
| 2006/0139642 A1 | * | 6/2006 | Van Bilsen | G03F 9/7049 356/400 |
| 2007/0002298 A1 | * | 1/2007 | Visser | G03F 9/7076 355/55 |
| 2007/0210460 A1 | * | 9/2007 | Thallner | B82Y 10/00 257/797 |
| 2011/0013165 A1 | * | 1/2011 | Kaneko | G03F 9/7011 355/61 |

FOREIGN PATENT DOCUMENTS

| KR | 101066626 B1 | 9/2011 |
| WO | 2018017389 A1 | 1/2018 |
| WO | 2018195096 A1 | 10/2018 |

OTHER PUBLICATIONS

International Search Report and the Written Opinion for International Application No. PCT/US2019/055151 dated Jan. 23, 2020, 10 pages.

* cited by examiner

*Primary Examiner* — Christina A Riddle
(74) *Attorney, Agent, or Firm* — Patterson + Sheridan LLP

(57) ABSTRACT

A method of aligning a plate containing a substrate is disclosed wherein multiple cameras with distinct fields of view are aligned with mark cells that are within the field of view of each of the multiple cameras.

20 Claims, 7 Drawing Sheets

SELF ALIGNING SYSTEMS AND METHODS FOR LITHOGRAPHY SYSTEMS

BACKGROUND

Field

Embodiments of the present disclosure generally relate to apparatuses, systems and methods for processing one or more substrates, and more specifically to apparatuses, systems and methods for performing photolithography processes. More specifically, aspects of the disclosure relate to self-aligning digital lithography tools and methods.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. In other configurations, organic light emitting diodes (OLEDs) are used if conditions permit. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices at the prices demanded by consumers, new apparatuses and approaches are needed to precisely and cost-effectively create patterns on substrates, such as large area substrates.

In digital lithography tools, images from a camera are used to find a position of alignment marks so that processing may occur across at a known location. In order to obtain the images, cameras are calibrated and specially chosen for pixel size, orientation (rotation) and uniformity.

Errors in camera pixel size, for example, translates to mark position errors. In such situations, accumulated error is proportional to the distance of alignment mars to the center of the field of view (FOV) of the camera.

In order to minimize the error that can accumulate, one method that is used to by operators and system designers is to move the stage carrying the substrate in an iterative manner, so the alignment mark is at the center of the camera FOV. Such movements may be made manually or by computer.

Such methods of compensation, however, do not allow for performing parallel alignment where each eye takes a picture of an alignment mark under each respective eye in parallel which results in longer total alignment times.

Under such methods, it has been found that uniformity of the camera FOV towards the edges of the FOV is not as good as the center of the FOV. This may be related to optical geometric distortion, illumination and/or focus lack of uniformity. Inconsistency with image uniformity may also translate into mark position error as well as alignment repeatability.

In order to achieve parallel alignment, it must be also assumed that the pitch of an alignment mark location is the same as the pitch of eye placement. Any deviation from nominal eye location may result in an inability to capture alignment marks by all of the system eyes at the same time.

Such conventional systems and methods also make parallel alignment impractical as the time to accomplish these methods are time consuming.

There is a need, therefore, to provide for methods and systems of alignment in digital lithography; that is not time consuming, but is accurate for the intended alignment purposes.

SUMMARY

A method of aligning a plate containing a substrate is disclosed wherein multiple cameras with distinct fields of view are aligned with mark cells that are within the field of view of each of the multiple cameras.

In one example embodiment, a method of alignment for a substrate in a lithography system is disclosed comprising placing a substrate and for at least two cameras for the lithography system, sighting a mark cell located with a field of view for each of the two cameras, such that each of the mark cells is aligned with a portion of the field of view of each of the two cameras.

In a second example embodiment, a method of alignment for a substrate in a lithography system is disclosed comprising placing a substrate, the substrate having at least two mark cells and for at least two cameras for the lithography system, sighting a first mark cell located with a first field of view of a first of the at least two cameras and sighting a second mark cell located with a second field of view for a second of the at least two cameras, aligning a center of the first field of view with the first mark cell and aligning a center of the second field of view with the second mark cell.

In another example embodiment, a method of alignment for a substrate in a lithography system is disclosed, comprising: placing a substrate in the lithography system, the substrate having at least two mark cells and for at least two cameras for the lithography system, sighting a first mark cell located with a first field of view of a first of the at least two cameras and sighting a second mark cell located with a second field of view for a second of the at least two cameras, aligning a center of the first field of view with the first mark cell and aligning a center of the second field of view with the second mark cell, wherein each of the first mark cell and the second mark cell have a coded alignment mark.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the aspects described below, eye configurations, alignment mark shapes, and cell codes are representative to give an example. There might be any number of eyes and any number of steps to capture alignment mark images. The shape of an alignment mark is not limited by the cross shape. The alignment mark may be any shape. A mark cell code may be implemented by either OCR, shape changes or size changes. The mark cell code can also be embedded to mark itself by changing the thickness of lines or adding additional features to lines. The illustrated embodiments, therefore, are merely descriptive in nature and should not be considered limiting.

Figure 1A:
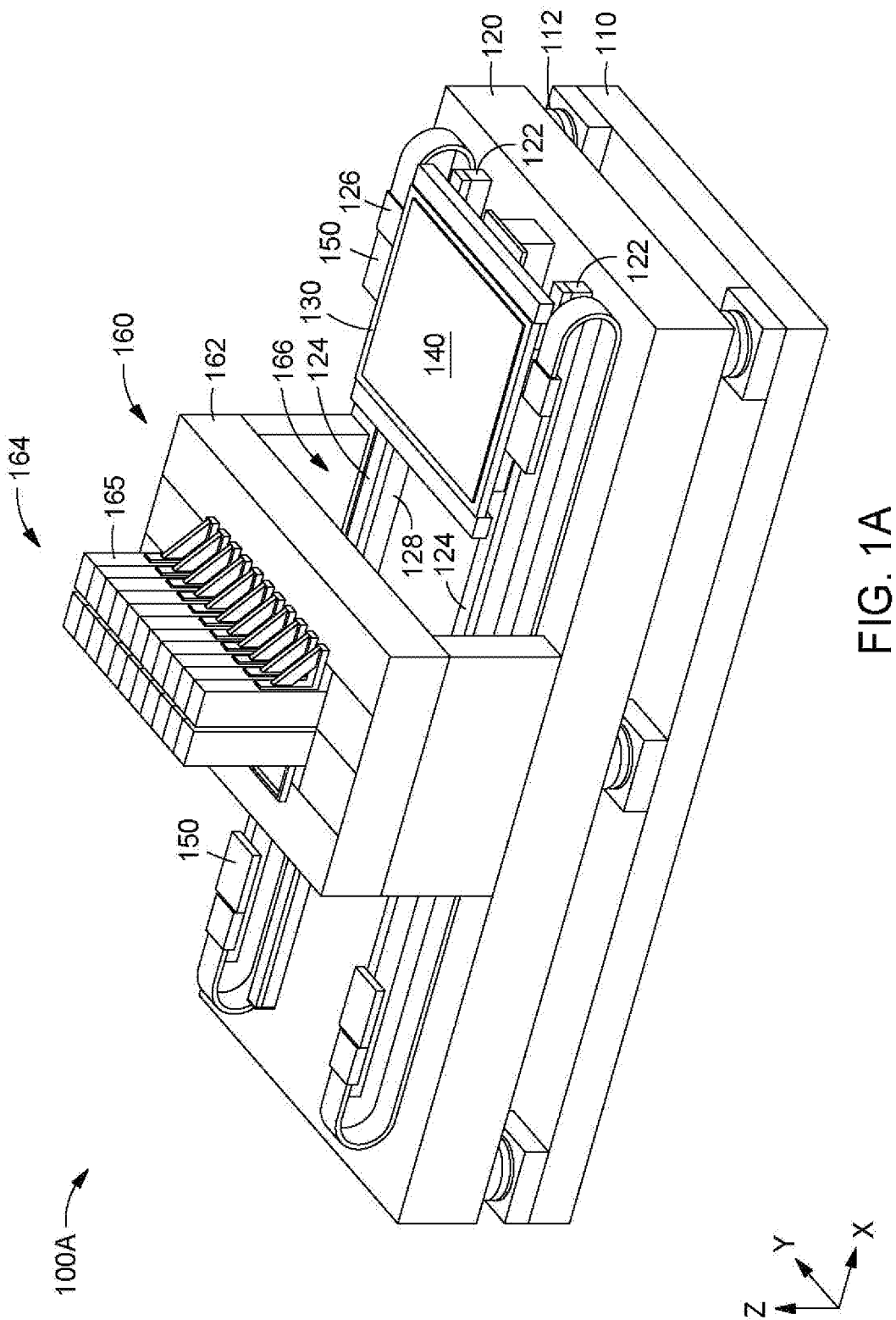
FIG. 1A is a perspective view of a photolithography system according to embodiments disclosed herein.

FIG. 1A is a perspective view of a photolithography system 100A according to embodiments disclosed herein. The system 100A includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100A includes a pair of supports 122 and a pair of tracks 124. The pair of supports 122 are disposed on the slab 120, and the slab 120 and the pair of supports 122 are a single piece of material. The pair of tracks 124 is supported by the pair of the supports 122, and the stage 130 moves along the tracks 124 in the X-direction. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by the image projection apparatus 270, shown in FIGS. 2A-2B. These techniques may be used in combination.

Figure 1B:
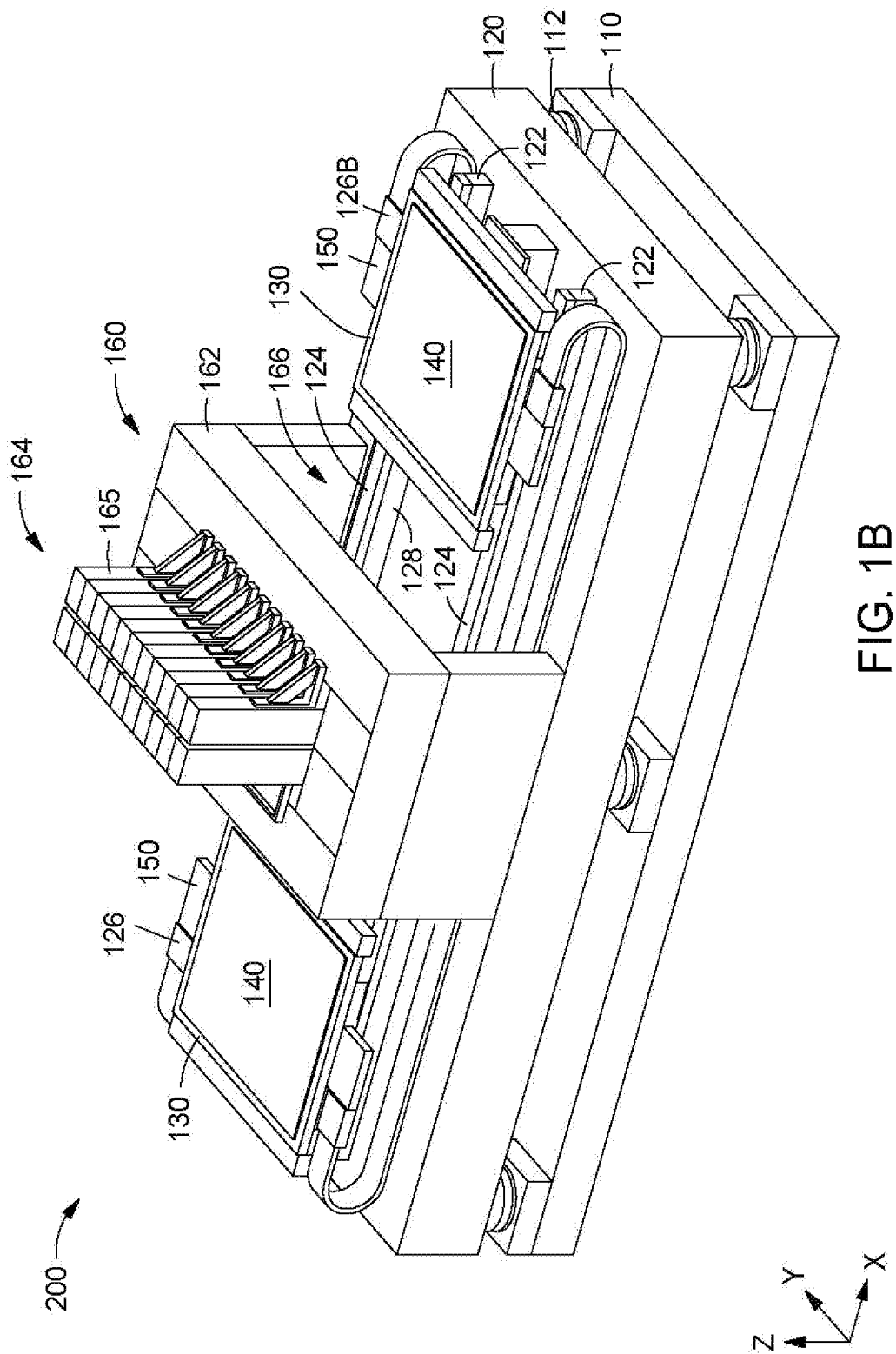
FIG. 1B is a perspective view of a photolithography system according to embodiments disclosed herein.

FIG. 1B is a perspective view of a photolithography system 200 according to embodiments disclosed herein. The system 200 is similar to the system 100; however, the system 200 includes two stages 130. Each of the two stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2A:
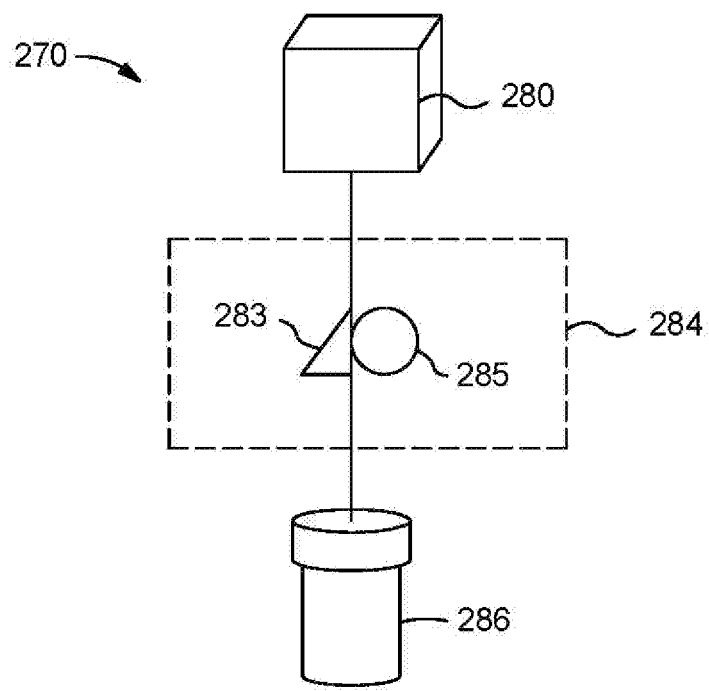
FIG. 2A is a perspective schematic view of an image projection apparatus according to embodiments disclosed herein.

FIG. 2A is a perspective schematic view of an image projection apparatus 270 according to one embodiment, which is useful for a photolithography system, such as system 100A or system 200. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, digital micromirror devices (DMDs) and liquid crystal displays (LCDs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and the back through the lens of the camera 285 an imaged onto sensors to detect whether the image projection apparatus 270 is in focus. The camera 285 is used to image the substrate, such as substrate 140, to ensure the alignment of the image projection apparatus 270 and photolithography system 100 or 200 is correct or within an predetermined tolerance. The projection optics 286, such as one or more lenses, is used to project the light onto the substrate, such as the substrate 140.

Figure 2B:
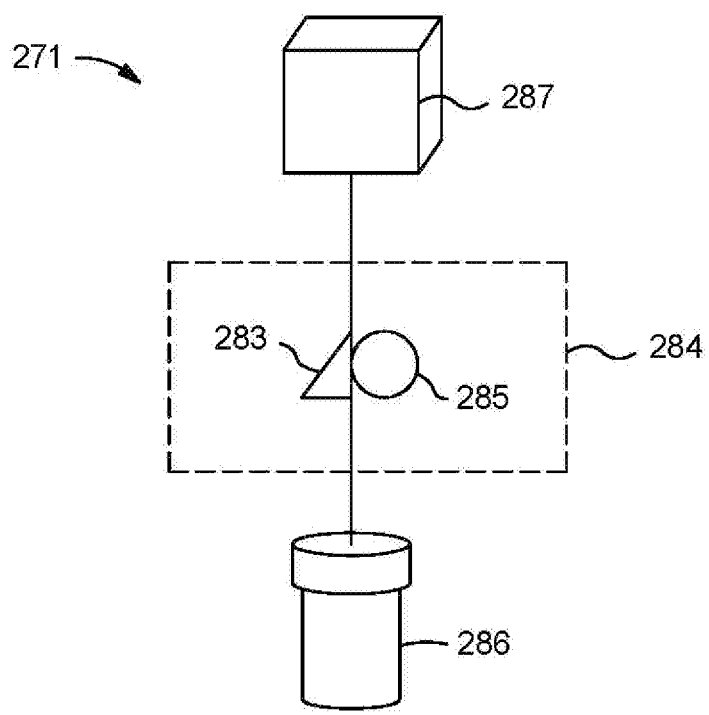
FIGS. 2B-2C are perspective schematic views of an image projection apparatus according to embodiments disclosed herein.

FIG. 2B is an image project apparatus 271 according to embodiments described herein. In the embodiment shown in FIG. 2B, the image projection apparatus 271 includes one or more microLEDs 287 as the spatial light modulator(s), a focus sensor 283, a camera system 284, and projection optics 286. In one embodiment, the image projection apparatus 271 further includes a beamsplitter (not shown). MicroLEDs are microscopic (for example, less than about 100 μm) light emitting diodes, which may be arranged in an array and used to form the individual pixels of a substrate, such as a display device. MicroLEDs include inorganic materials, such as an inorganic Gallium Nitride (GaN) material. Since microLEDs are self-emitting, an outside light source is not needed in the image projection apparatus 271.

In embodiments using microLEDs, the camera 285 is also useful to measure the image pixel pitch of the one or more microLEDs to calibrate for any thermal expansion happening at the microLED device.

Figure 2C:
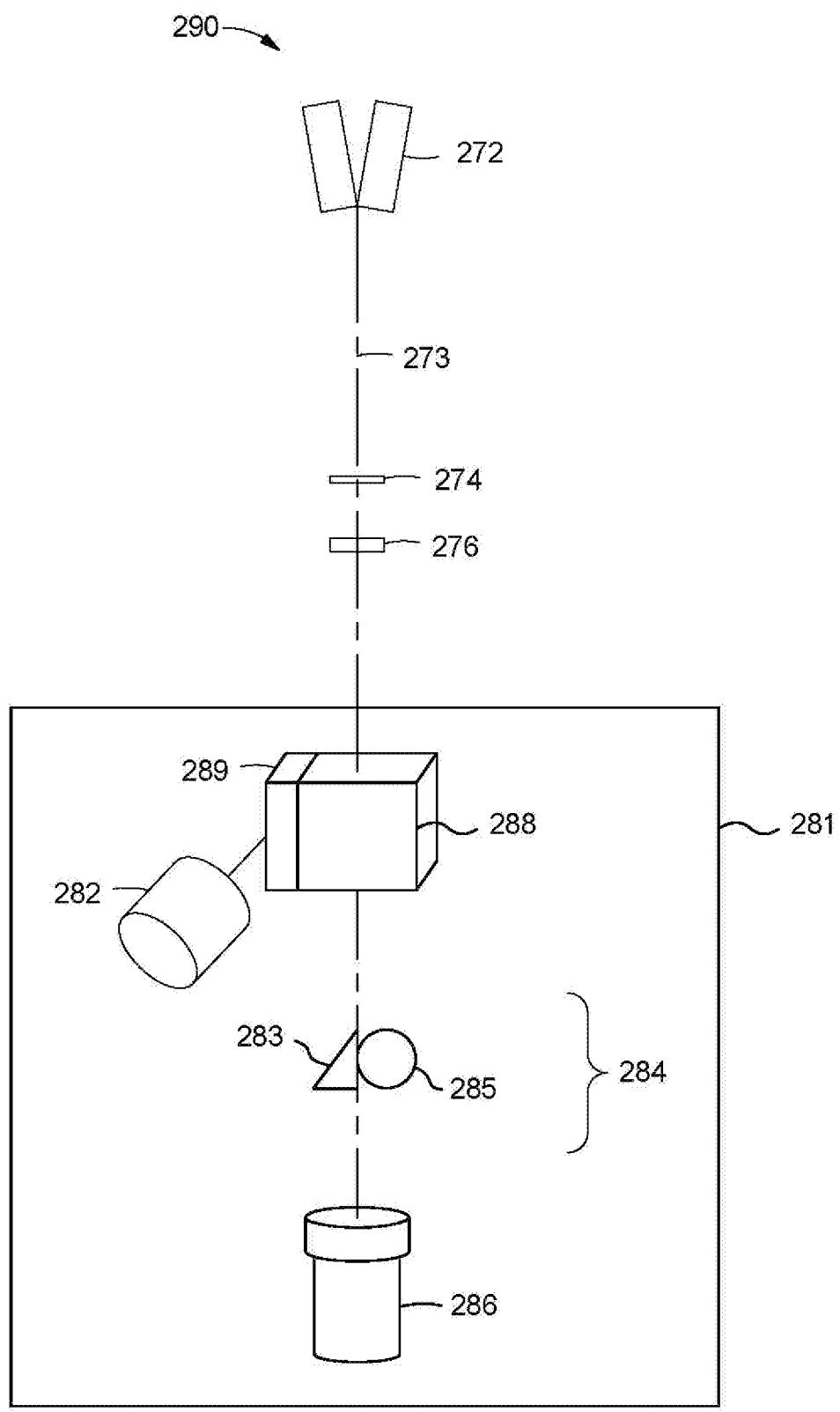

FIG. 2C is an image project apparatus 281 according to embodiments described herein. In the embodiment shown in FIG. 2C, the image projection apparatus 281 uses one or more DMDs 289 as the spatial light modulator(s). The image projection apparatus 281 is part of an image projection system 290, which includes a light source 272, an aperture 274, a lens 276, a frustrated prism assembly 288, one or more DMDs 289 (one is shown), and a light dump 282, in addition to the alignment and inspection system 284, the focus sensor 283, and the projection optics 286. The light source 272 is any suitable light source, such as a light emitting diode (LED) or a laser, capable of producing a light having predetermined wavelength. In one embodiment, the predetermined wavelength is in the blue or near ultraviolet (UV) range, such as less than about 450 nm. The frustrated prism assembly 288 includes a plurality of reflective surfaces. The projection lens 286 is, as an example, a 10× objective lens. During operation of the image projection apparatus 281 shown in FIG. 2C, a light beam 273 having a predetermined wavelength, such as a wavelength in the blue range, is produced by the light source 272. The light beam 273 is reflected to the DMD 289 by the frustrated prism assembly 288. The DMD includes a plurality of mirrors, and the number of mirrors corresponds to the number of pixels to be projected. The plurality of mirrors are individually controllable, and each mirror of the plurality of mirrors is at an "on" position or "off" position, based on the mask data provided to the DMD 289 by the controller (not shown). When the light beam 273 reaches the mirrors of the DMD 289, the mirrors that are at "on" position reflect the light beam 273, i.e., forming the plurality of write beams, to the projection lens 286. The projection lens 286 then projects the light beams to the surface of the substrate. The mirrors that are at "off" position reflect the light beam 273 to the light dump 282 instead of the surface of the substrate.

Figure 3:
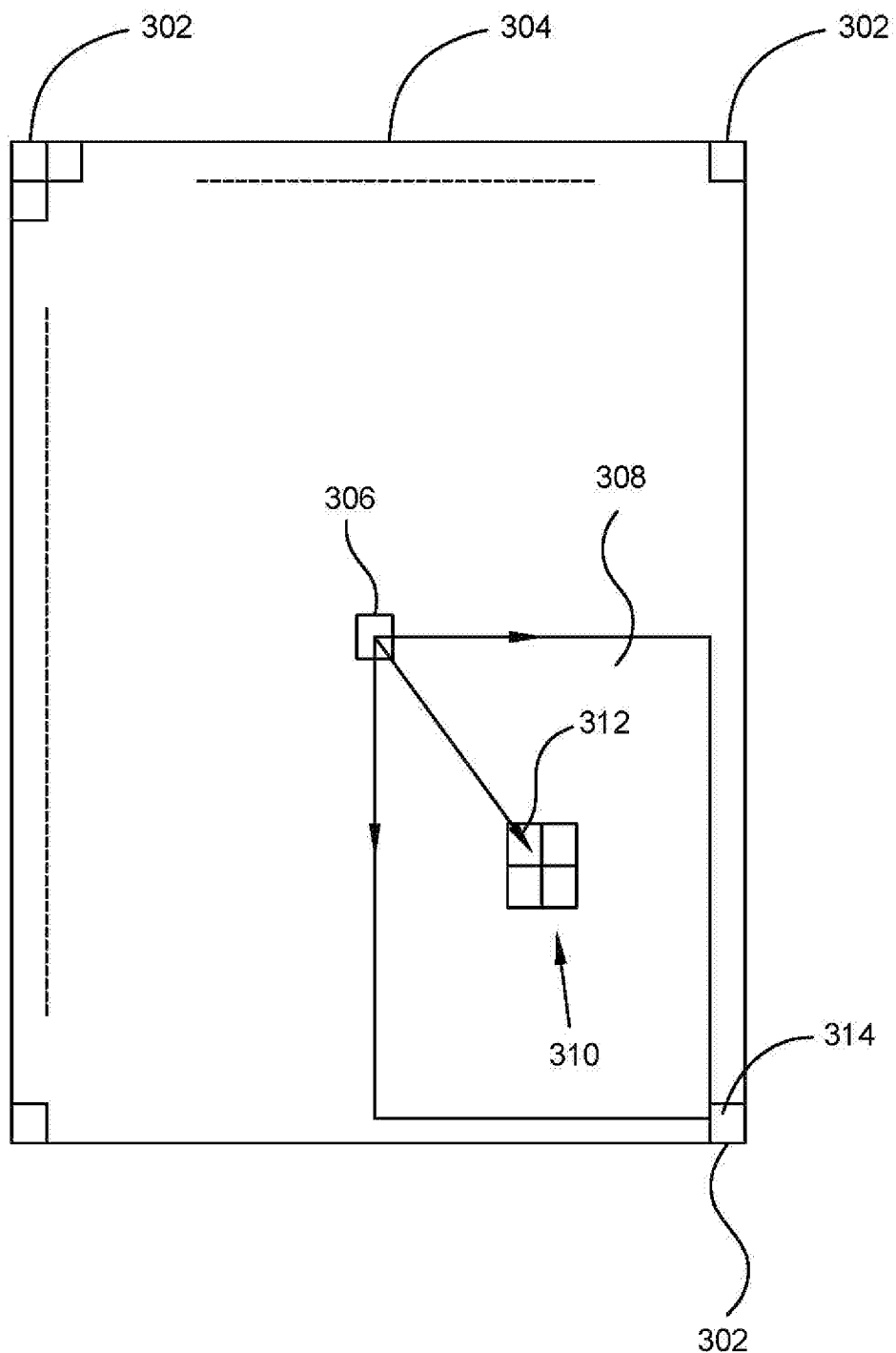
FIG. 3 is a schematic diagram of a stage with mark cells positioned on the stage.

Referring to FIG. 3, one aspect of the disclosure is described. Instead of using a single alignment mark on a stage for each camera FOV, as provided in conventional apparatus, an array of coded alignment marks (defined as mark cells) on the plate extended to multiple FOVS.

A search area is defined at the center of a camera FOV. The search area size is equal, in one example embodiment, to two times the alignment a mark cell height and width and centered at the center of a camera FOV.

In the example embodiment, each mark cell has a code to define the column and row within the alignment mark grid. An image processing algorithm is used to find the center of an alignment mark within the search area and reads the code which defines the column and row.

In the example embodiment the position of the mark with respect to original design is defined as:

$$\Delta x = \Delta x'$$

$$\Delta y = \Delta y'$$

Where ($\Delta x'$, $\Delta y'$) is the position of the mark with respect to FOV center within the search area after a camera transformation is applied. The original mark position is defined by mapping mark cell code to mark cell coordinate:

$$x_{dc} = x_m + \Delta * c$$

$$y_{dc} = y_m + \Delta * r$$

As provided in FIG. 3, a mark cell 302 is provided on the substrate 304. A mark cell at 306 notes the (0,0) in the mark cell grid. The shaded box (Camera FOV) region 308 illustrates a camera FOV. As will be understood, different camera FOVs may be located around the substrate 304 according to their respective position with relation to the plate. A search area 310 is defined within the camera FOV region 308 for searches to be performed. The value of c and r are obtained as positions that are related to the (0,0) in the mark cell grid. As an example, mark 312 is at location at (c,r). In another example embodiment, the mark cell at 314 is located at (N,−M) in the mark cell grid.

Figure 4B:
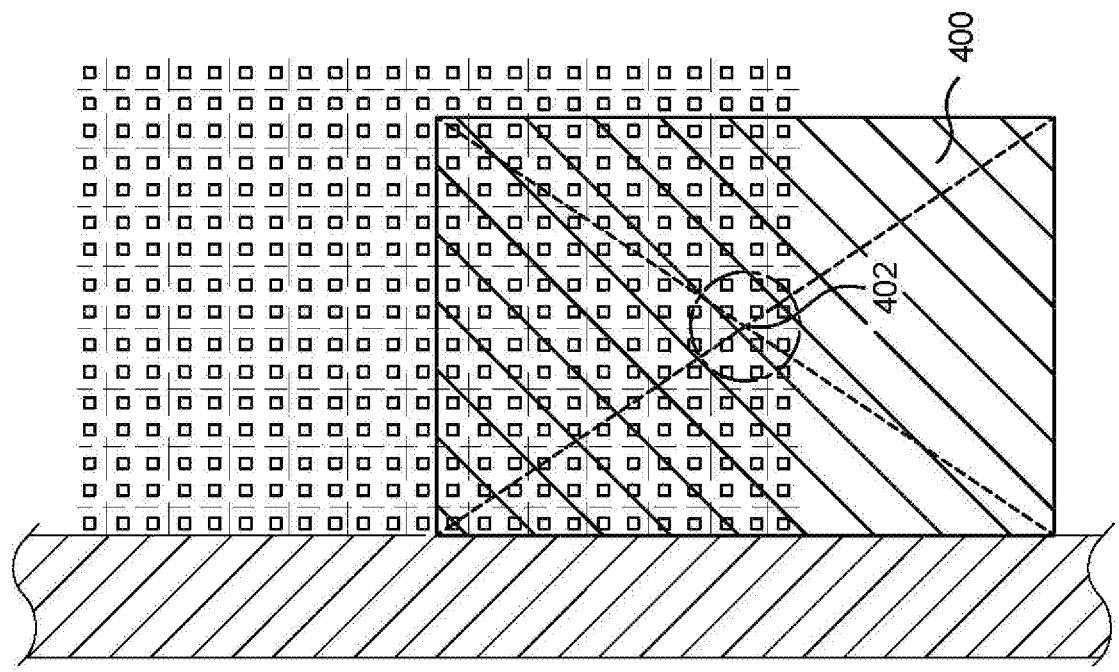
FIGS. 4A and 4B are schematic diagrams of a stage with eye camera FOV.
Figure 4A:
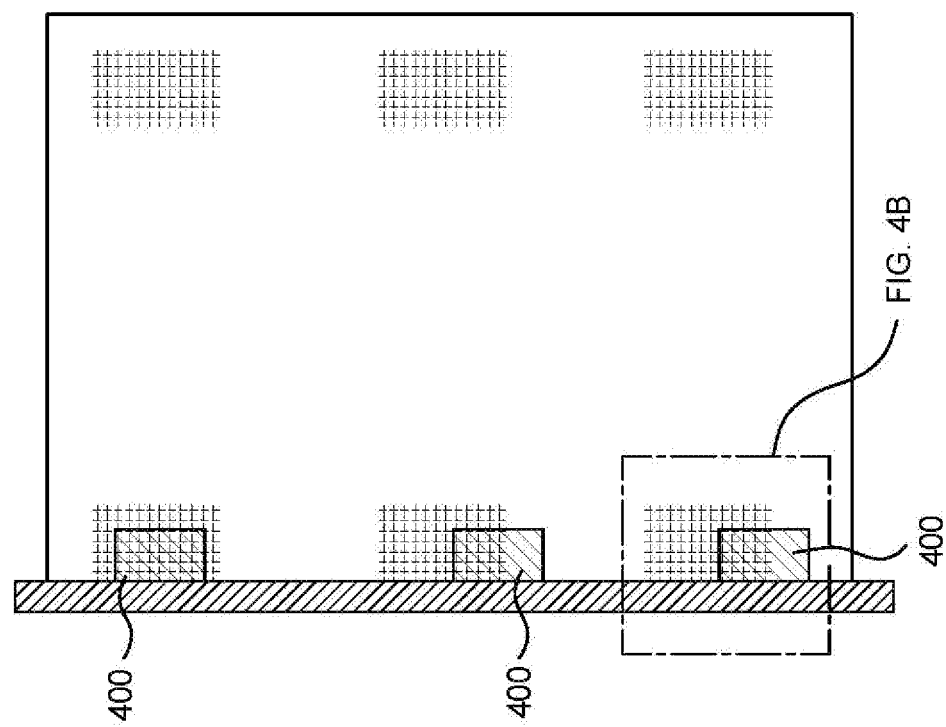

Referring to FIGS. 4A and 4B, the use of mark cells is illustrated. A single stage (plate) is illustrated. Although illustrated as a single stage, multiple stages may be used.

Cameras are positioned along a movable bridge to a field of view 400 is created for each camera. In the illustrated embodiment, the cameras are fix mounted and the stage is configured to move where another field of view will be created. In other embodiments, the cameras may be made to move with the stage fixed. Searching may be accomplished in each of the field of views for the cameras so that alignment may occur. By having six (6) measurement points, the alignment may occur in a highly accurate fashion. FIG. 4B illustrates an expanded view of the field of view. Mark cells 402 are positioned as illustrated in the diagram. For accuracy, a mark cell 402 that is positioned near the center of camera field of view may be used for alignment purposes.

If the alignment of the plate is improper, proper alignment may be achieved by repositioning the substrate and performing an alignment check once again. A threshold may be established that the alignment must be within a threshold deviation. If alignment is within the threshold deviation then no movement of the substrate is required. As the regular are recurring mark cells may be quickly identified, the amount of alignment difficulty may be determined.

Figure 5:
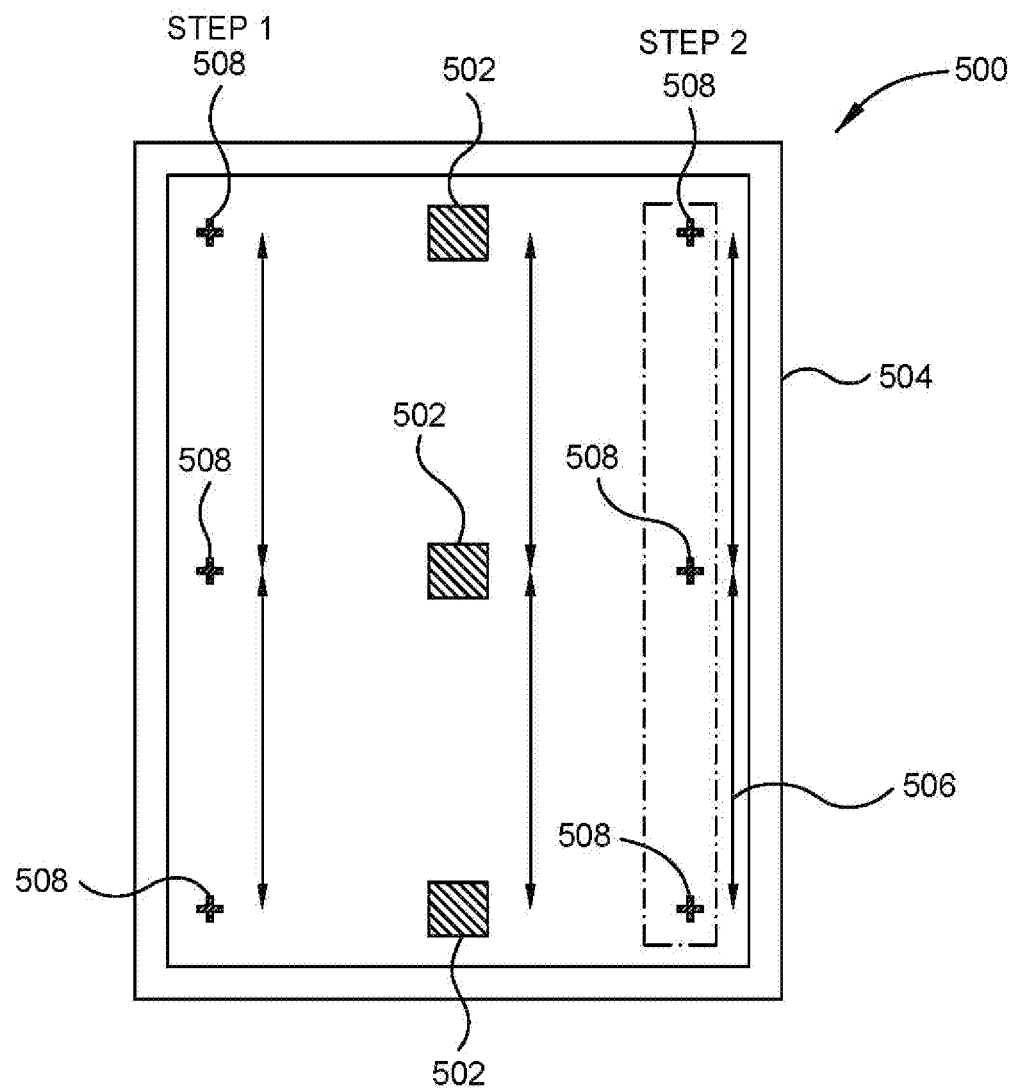
FIG. 5 is a schematic diagram of a stage used for parallel alignment purposes.

Referring to FIG. 5, a schematic diagram of parallel alignment is illustrated. An arrangement 500 is illustrated that may be used to accomplish the method. Three cameras 502 are illustrated and fixed over a plate or stage 504 containing a substrate 506. In other embodiments, the cameras 502 may be movable and the stage movable. Mark cells 508 are placed upon the substrate 506 such that alignment of the cameras 502 may be accomplished. The cameras 502 may be movable over the surface of the substrate 506 to allow for scanning of the surface. In other embodiments, a greater number of cameras may be used such that the entire field of view of all of the cameras may view the entire substrate.

In still other embodiments, the height of the cameras above the substrate may be increased, thus increasing the overall scanned area due to the greater scanned area. As illustrated the three (3) cameras may be considered as a mere example as lesser or greater number of cameras may be used.

In a process of parallel alignment, a first scan by the cameras 502 may be accomplished. Such a scan is labeled at step 1. A second scan may then be accomplished when the cameras 502 are located over the dash-dotted section of the substrate 506, as labeled at step 2. By taking measurements at all six locations, the alignment of the substrate can be made with great accuracy.

Aspects of the methods and apparatus provide significant advantages compared to conventional apparatus and methods. The methods provided allow for timely and accurate positioning of a stage for digital lithography. Errors in camera pixel size and camera rotation calibration error are eliminated and thus, translation of such errors to mark position errors is prevented. No accumulated error is present in the aspects described compared to conventional apparatus.

The methods and apparatus disclosed prevent the use of iterative methods so alignment marks are at the center of the camera FOV. The aspects described also provide for parallel alignment.

Aspects of the disclosure do not have the problems of uniformity in conventional apparatus.

In one example embodiment, a method of alignment for a lithography system is disclosed comprising: placing a substrate and for at least two cameras for the lithography system, sighting a mark cell located with a field of view for each of the two cameras, such that each of the mark cells is aligned with a portion of the field of view of each of the two cameras.

In another example embodiment, the method may be performed wherein the aligning the portion of the field of view of each of the two cameras and each of the mark cells is through an algorithm.

In another example embodiment, the method may be performed wherein the plate is a single plate.

In another example embodiment, the method may be performed wherein the plate is multiple plates.

In another example embodiment, the method may further comprise defining a search area for each of the at least two cameras, wherein the sighting of the mark cell occurs within the defined search area of each camera.

In another example embodiment, the method may be performed wherein each mark cell has a height and a width.

In another example embodiment, the method may be performed wherein a search area is equal in size, to a multiple of a mark cell height and width.

In another example embodiment, the method may be performed wherein the multiple is an integer.

In another example embodiment, the method may be performed wherein the integer is two.

In another example embodiment, the method may be performed wherein each mark cell is a coded alignment mark.

In another example embodiment, a method of alignment for a substrate in a lithography system is disclosed comprising placing a substrate, the substrate having at least two mark cells and for at least two cameras for the lithography system, sighting a first mark cell located with a first field of view of a first of the at least two cameras and sighting a second mark cell located with a second field of view for a second of the at least two cameras, aligning a center of the first field of view with the first mark cell and aligning a center of the second field of view with the second mark cell.

In another example embodiment, the method may be performed wherein at least one of the first mark cell and the second mark cell have a cross hair for alignment.

In another example embodiment, the method may be performed further comprising defining a first search area for a first of the at least two cameras and defining a second search area for a second of the at least two cameras.

In another example embodiment, the method may further comprise searching the first search area to perform the sighting of the first mark cell.

In another example embodiment, the method may further comprise searching a second search area to perform the sighting of the second mark cell.

In another example embodiment, the method may be performed wherein one of the first search area and the second search area is equal in size, to a multiple of a mark cell height and width.

In another example embodiment, the method may be performed wherein each mark cell is a coded alignment mark.

In another example embodiment, the method may be performed wherein the plate is a single plate.

In another example, the method may be performed wherein the plate is multiple plates.

In another example, the method may be performed wherein the aligning is through an algorithm.

In another example embodiment, a method of alignment for a substrate in a lithography system is disclosed, comprising: placing a substrate in the lithography system, the substrate having at least two mark cells and for at least two cameras for the lithography system, sighting a first mark cell located with a first field of view of a first of the at least two cameras and sighting a second mark cell located with a second field of view for a second of the at least two cameras, aligning a center of the first field of view with the first mark cell and aligning a center of the second field of view with the second mark cell, wherein each of the first mark cell and the second mark cell have a coded alignment mark.

What is claimed is:

1. A method of aligning a plate of a lithography system, comprising:
   placing a substrate on the plate in the lithography system;
   providing a plurality of mark cells within an alignment mark cell grid, the plurality of mark cells being associated with one of the lithography system and the substrate, wherein each of the mark cells comprises a code to define a column and a row within the alignment mark cell grid;
   providing at least two cameras for the lithography system such that a field of view of each of the at least two cameras sights at least one mark cell;
   defining a search area at a center of the field of view for each of the at least two cameras, the search area having a smaller size than the field of view of each of the at least two cameras, wherein the sighting of the mark cell occurs within the defined search area of each camera;
   finding a center of each mark cell within the search area of each camera;
   reading the code of each mark cell; and
   aligning one of the plate and the substrate of the lithography system based upon the field of view of the at least two cameras and the code of each mark cell.

2. The method according to claim 1, wherein the aligning the one of the plate and the substrate is through an algorithm.

3. The method according to claim 1, wherein the plate is a single plate.

4. The method according to claim 1, wherein the plate is multiple plates.

5. The method according to claim 1, wherein each mark cell has a height and a width.

6. The method according to claim 5, wherein the search area is equal in size to a multiple of a mark cell height and width.

7. The method according to claim 6, wherein the multiple is an integer.

8. The method according to claim 7, wherein the integer is two.

9. A method of alignment for a substrate on a plate in a lithography system, comprising:
   placing the substrate on the plate in the lithography system, the substrate having a plurality of mark cells within an alignment mark cell grid, wherein each of the mark cells comprises a code to define a column and a row within the alignment mark cell grid;
   for at least two cameras for the lithography system, sighting a first mark cell located with a first field of view of a first of the at least two cameras and sighting a second mark cell located with a second field of view for a second of the at least two cameras;
   defining a first search area at a center of the first field of view for the first camera and defining a second search area at a center of the second field of view for the second camera, the first and second search areas each having a smaller size than the first and second field of views;
   aligning the first search area of the first field of view with the first mark cell;
   aligning the second search area of the second field of view with the second mark cell; and
   reading the codes of the first and second mark cells to align one of the plate and the substrate of the lithography system.

10. The method according to claim 9, wherein at least one of the first mark cell and the second mark cell have a cross hair for alignment.

11. The method according to claim 9, further comprising:
    searching the first search area to perform the sighting of the first mark cell.

12. The method according to claim 11, further comprising:
    searching the second search area to perform the sighting of the second mark cell.

13. The method according to claim 12, wherein one of the first search area and the second search area is equal in size to a multiple of a mark cell height and width.

14. The method according to claim 9, wherein the plate is a single plate.

15. The method according to claim 9, wherein the plate is multiple plates.

16. A method of alignment for a substrate in a lithography system, comprising:
    placing the substrate in the lithography system, the substrate having a plurality of mark cells within an alignment mark cell grid, wherein each of the mark cells comprises a code to define a column and a row within the alignment mark cell grid;
    for at least two cameras for the lithography system, sighting a first mark cell located with a first field of view of a first of the at least two cameras and sighting a second mark cell located with a second field of view for a second of the at least two cameras;
    defining a first search area at a center of the first field of view for the first camera and defining a second search area at a center of the second field of view for the second camera, the first and second search areas each having a smaller size than the first and second field of views;
    aligning the first search area of the first field of view with the first mark cell;
    aligning the second search area of the second field of view with the second mark cell;
    reading the codes of the first and second mark cells; and
    aligning one of the plate and the substrate of the lithography system based upon the field of view of the at least two cameras and the code of each mark cell.

17. The method according to claim 16, wherein each of the plurality of mark cells have a height and a width.

18. The method according to claim 17, wherein the first search area and the second search area are each equal in size to a multiple of a mark cell height and width.

19. The method according to claim 18, wherein the multiple is an integer.

20. The method according to claim 19, wherein the integer is two.

* * * * *